United States Patent [19]
Brown et al.

[11] Patent Number: 5,852,637
[45] Date of Patent: Dec. 22, 1998

[54] SERIAL MULTI-GB/S DATA RECEIVER

[75] Inventors: Anthony Kevin Dale Brown, Kanata;
Richard Ralph Goulette, Arnprior;
Roderick Edgar Wallace, Perth;
Rodney David Pike, Nepean, all of Canada

[73] Assignee: Northern Telecom Limited, Montreal, Canada

[21] Appl. No.: 568,911

[22] Filed: Dec. 7, 1995

[51] Int. Cl.⁶ .................................................. H04L 27/06
[52] U.S. Cl. ............................................................. 375/316
[58] Field of Search .................................. 375/316, 318, 375/257, 238; 327/65; 330/252

[56] References Cited

U.S. PATENT DOCUMENTS

| | | | |
|---|---|---|---|
| 4,259,601 | 3/1981 | Stein | 307/359 |
| 4,386,282 | 5/1983 | Scavuzzo | 377/81 |
| 4,488,063 | 12/1984 | Lee | 307/289 |
| 5,079,443 | 1/1992 | Wada et al. | 307/362 |
| 5,432,486 | 7/1995 | Wong | 333/109 |

FOREIGN PATENT DOCUMENTS

| | | | |
|---|---|---|---|
| 0 272 011 A2 | 11/1987 | European Pat. Off. | H03K 19/086 |
| 0 419 764 A2 | 7/1990 | European Pat. Off. | G03K 3/295 |

OTHER PUBLICATIONS

"Analysis and Design of Analog Integrated Circuits", pp. 491–499, Gray et al, University of California at Berkeley, John Wiley & Sons, Inc., New York.

Primary Examiner—Tesfaldet Bocure
Attorney, Agent, or Firm—George MacGregor; Dallas F. Smith

[57] ABSTRACT

A data pulse receiver for detecting and amplifying serial data pulses received at gigabit-per-second rates over a transmission medium through which the signal levels have been substantially attenuated. The receiver, in a preferred embodiment, has grounded base differential amplifiers to give impedance matching, signal amplification and wide frequency bandwidth. A regenerative flip-flop with programmable tail current provides hysteresis in order to suppress unwanted noise signals. The flip-flop also returns the data pulses to NRZ format. The receiver may also include means for automatic adjustment of the hysteresis level.

16 Claims, 3 Drawing Sheets

5,852,637

SERIAL MULTI-GB/S DATA RECEIVER

FIELD OF THE INVENTION

This invention relates to a data receiver and more particularly to a receiver for detecting and amplifying low level data pulses.

BACKGROUND OF THE INVENTION

With the current emphasis on the Information Highway and the explosion of telecommunications in general, the quantity and speed of data transmission continues to grow. In the telecommunications industry, as well as in computer technology, there exists a need to transmit large quantities of data from point to point, for example between memory and processors in multiple processor computers. The large number of data bits coupled with the large number of connections create an interconnect bottle neck which requires large numbers of data drivers with their associated large amount of electrical power. One technique that is employed to overcome this congestion difficulty is to multiplex large numbers of parallel bit streams up to higher rate serial bit streams, thus reducing the numbers of electrical connections that need to be made. The need for low power multiplex and demultiplex circuits capable of combining data signals at 50 Mb/s up to 1 Gb/s, for example, has attracted considerable interest among commercial integrated circuit vendors. Nevertheless, the computer and communications industries continue to search for lower power solutions.

PRIOR ART

In addition to the aforementioned interconnect bottle neck associated with multi-processor computers, the high data speeds can also lead to the generation of electromagnetic interference (EMI) problems at physical interfaces such as conventional connectors. One technique that has been employed successfully to reduce the number of interconnections and EMI in communications switching equipment involves a contactless backplane. This technique is based on directional coupling principles wherein data transfer occurs between proximate conductors. An example of one such coupling connector is described in U.S. Pat. No. 5,432,486 which issued Jul. 11, 1995 to Wong and assigned to Northern Telecom Limited. The technique can be expanded to permit point-to-multipoint and multipoint-to-point data transmission over a passive backplane without loss of signal integrity due to multipoint connectors. In this method, distribution of the multi gigabit-per-second serial data employs a form of a.c. coupling, of such small proportions, that the data information is contained in the data transitions. Thus a data signal in NRZ format on the transmission path is coupled to the receiver path as positive and negative going pulses. The received data at the demultiplex circuit is considerably attenuated: signal levels of only 70 mV peak-to-peak, or less, are not uncommon.

Reliable reception of this data requires special techniques including signal amplification, wide frequency bandwidth, matched input impedance, and some form of hysteresis to discriminate against unwanted noise. The resultant signal must also be capable of being restored to NRZ format. The present invention relates to the requirement of detecting serial data at gigabit-per-second rates received over a transmission medium through which the signal levels have been substantially attenuated.

SUMMARY OF THE INVENTION

It is an object of the present invention to provide a data pulse receiver to detect and amplify attenuated serial data received from a contactless backplane.

Therefore in accordance with the present invention there is provided a data pulse receiver. The receiver comprises a grounded base amplifier having a bipolar transistor with a base, a collector and an emitter, the base being connected to a.c. ground. The received positive and negative going data pulses are provided via an input connected to the emitter through an impedance matching arrangement. A constant current source is connected between the emitter and ground. A load resistor is connected between the collector and a positive supply. Hysteresis generating means having its own current supply is connected to the collector. An output terminal to deliver the amplified data output signal is connected between the collector and the load resistor.

In a preferred embodiment the receiver comprises a differential grounded base amplifier having a pair of bipolar transistors each with a base, a collector and an emitter, the bases being connected to a.c. ground. The received data pulses are provided via two inputs, the first input is connected to the emitter of the first transistor through a first impedance matching means and the second input is connected to the emitter of the second transistor through an impedance matching means. Each transistor has a constant current source connected between the transistor's emitter and ground. Each transistor has a load resistor connected between the transistor's collector and a positive supply. Hysteresis generating means having its own current supply and a set-reset flip-flop is connected to the collector of each transistor. Two output terminals are provided to deliver complementary data output signals. The first output terminal is connected to the collector of the first transistor, and the second output terminal is connected to the collector of the second transistor.

BRIEF DESCRIPTION OF THE DRAWINGS

The invention will now be described in greater detail with reference to the attached drawings wherein.

DETAILED DESCRIPTION OF THE INVENTION

Figure 1:
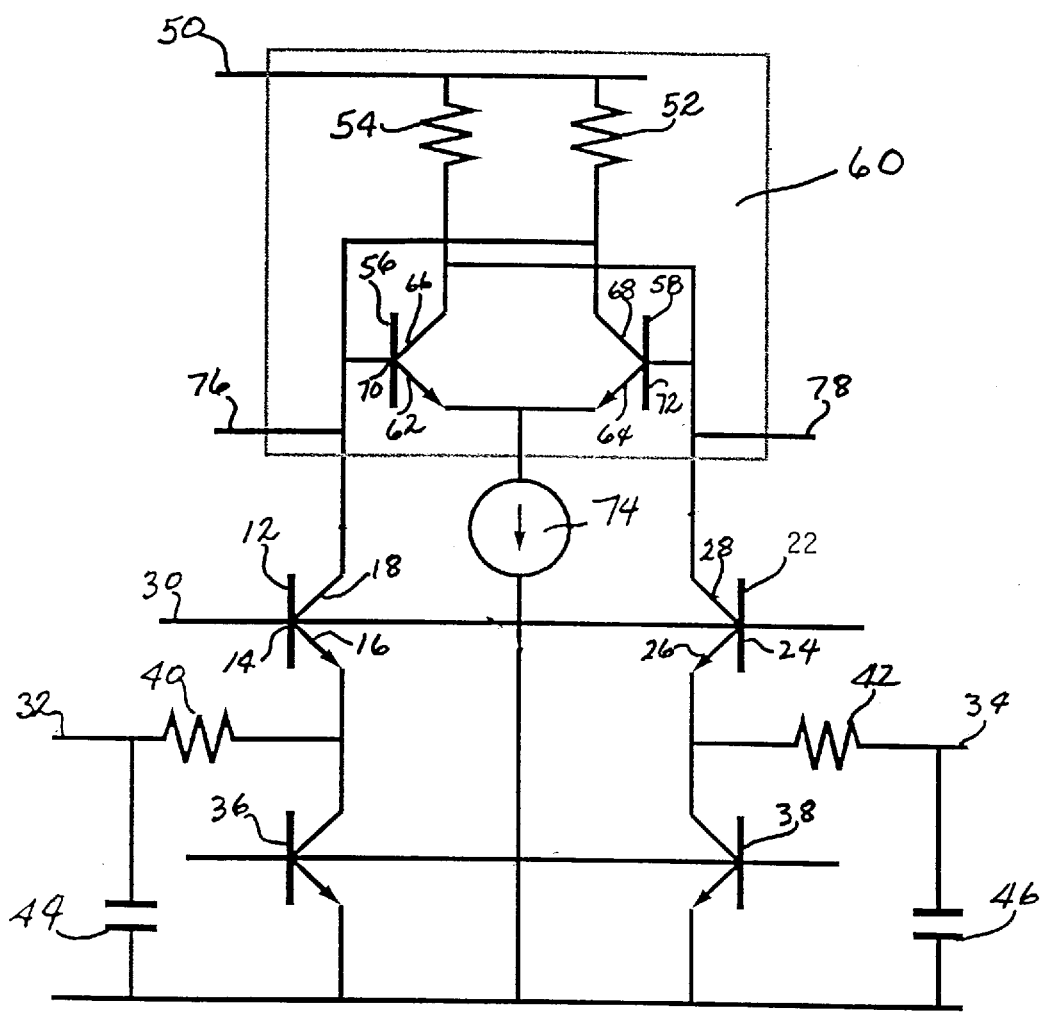
FIG. 1 is a circuit diagram of a preferred embodiment of the present invention.

FIG. 1 is a circuit diagram of one embodiment of the present invention. The receiver includes grounded base amplifier 12 having base 14, emitter 16 and collector 18, and grounded base amplifier 22 having base 24, emitter 26 and collector 28. Bases 14 and 24 are connected to a.c. ground at 30.

FIG. 1 is based on a differential input and to this end the coupled data pulses in differential format are supplied to negative input 32 and positive input 34. It is to be understood that the input need not be differential in which case the receiver would have a single input and a single grounded base amplifier.

Grounded base amplifiers 12 and 22 have constant current sources 36 and 38 respectively. Also shown in FIG. 1 are input impedance matching resistors 40 and 42. Capacitors 44 and 46 represent stray capacitance inherent in the structure.

The collectors 18 and 28 of transistors 12 and 22 respectively are connected to a positive source 50 through load resistors 52 and 54 respectively. Load resistors 52 and 54 in combination with bipolar transistors 56 and 58 form a regenerating flip-flop 60. Regenerating flip-flop 60 reconverts the Return to Zero RZ pulse signal to the required NRZ format. Transistors 56 and 58 include commonly connected emitters 62 and 64, collectors 66 and 68, and bases 70,72. The commonly connected emitters 62,64 are provided with tail current by current source 74. The output signal in NRZ format is provided at the complementary output terminals 76 and 78.

Figure 2:
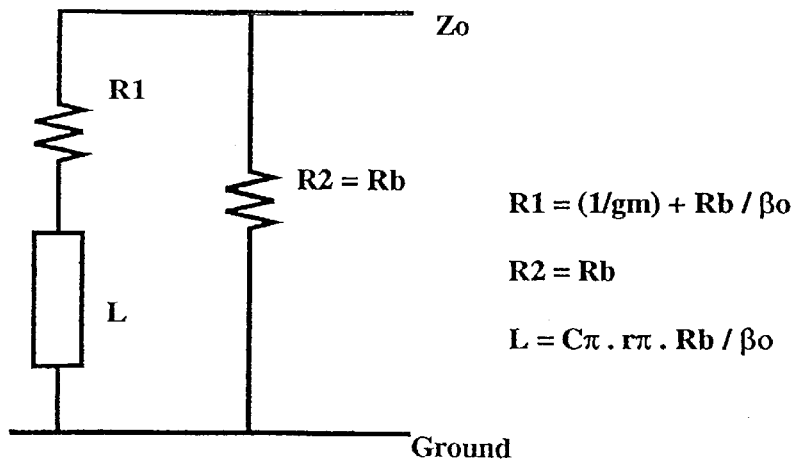
FIG. 2 is an equivalent circuit for emitter input impedance.
Figure 3:
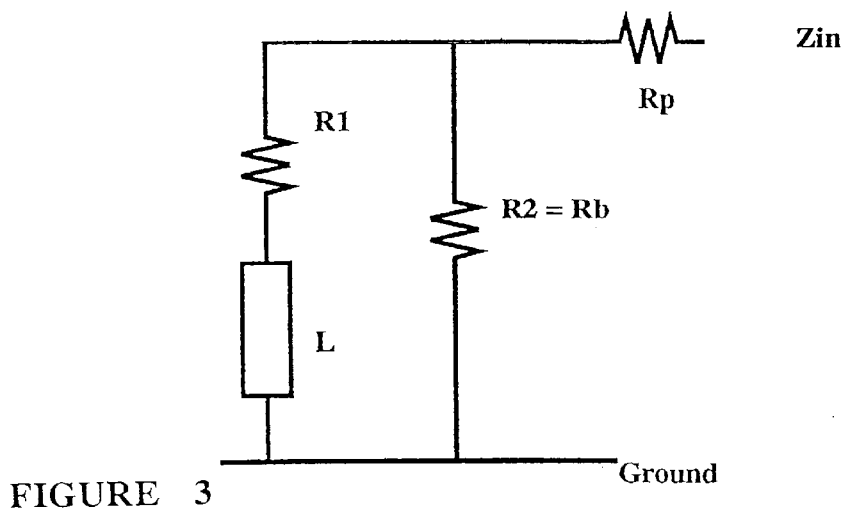
FIG. 3 is an equivalent circuit for grounded base amplifier input impedance.

The circuit of FIG. 1 obtains a matching impedance of, for example, 50 ohms by means of resistors 40 and 42 in the input circuit together with the input impedance of the grounded base differential amplifiers 12 and 22. The circuit has the largest possible bandwidth due to the use of the grounded base transistors. Also from Kirchoff's Law, it is clear that, apart from the effect of parasitic components, the entire signal energy is utilized by the grounded base amplifier. Further, the effect of parasitic capacitance on the input terminals, which would normally shunt the input signal, is compensated by the inductance seen at the emitter of the grounded base amplifier. This latter effect significantly extends the frequency response of the amplifier. Design of the grounded base amplifier is as follows:

According to Grey & Meyer, "Analysis and Design of Analog Integrated Circuits", Wiley, 3rd Edition 1993, page 497: the input impedance of a grounded base amplifier (equivalent to that of an emitter follower), has an equivalent circuit as shown in FIG. 2. Taking into consideration the input padding resistance of FIG. 1, the grounded base input impedance equivalent circuit is shown in FIG. 3. Bearing in mind that this input impedance will vary depending upon the amplitude of the input signal and the desirability of attaining an input impedance of approximately 50 ohms over the full range of the input pulse amplitude, this dictates the nominal emitter current required in the grounded base amplifier.

For example:

Suppose the maximum pulse level is 120 mV (single ended) and the minimum pulse level is 70 mV.

Then the maximum current pulse expected in a 50 ohm termination is 2.4 mA, and according to Kirchoff's Law, this current will pass through the grounded base amplifier emitter/collector circuit.

One can calculate the percentage mismatch error of the 50 ohm input impedance from:

$$\text{Error }(\%)=100*0.019*((1/(\text{Ie}-(\text{Vp}/50)))-(1/\text{Ie}))/50$$

where Ie is the emitter bias current and Vp is the pulse amplitude.

Figure 4:
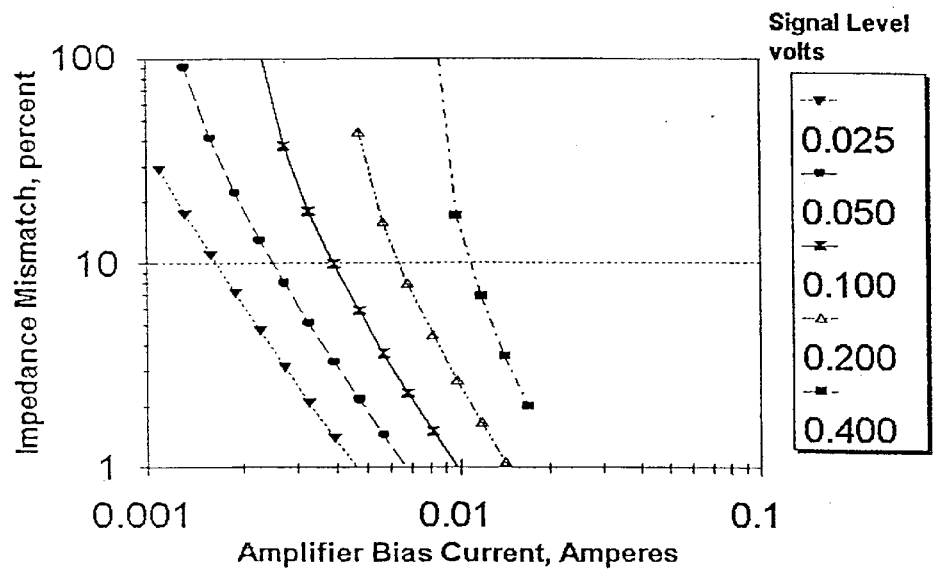
FIG. 4 shows the variation of 50 ohm termination impedance as a function of signal level and bias current.

The transistors of the grounded base amplifier will in general be quite large, in order to withstand electrostatic discharge potentials. Normally this protection will be augmented by means of parallel diodes (not shown). As a result, due to the size of the transistors, the effect of parasitic emitter and base resistance has been neglected since these will be quite small. The above results have been plotted in FIG. 4, showing the variation of impedance mismatch for various signal levels against the amplifier bias current.

As discussed previously, the grounded base amplifiers 12,22 are connected to a set-reset flip-flop 60. The magnitude of the tail current of the flip-flop 60 can be adjusted by current supply 74 to obtain a controlled amount of hysteresis. Specifically, the tail current can be adjusted to whatever threshold current is specified for the detection of the input signal current. It will be noted from FIG. 1 that due to the grounded base amplifiers, the input signal current passes through the collector load resistors 52,54 of the flip-flop 60. Also, the tail current of the flip-flop 60 passes through the same collector load resistors. Therefore, to change the state of the RS flip-flop 60, the voltage produced by the current pulses in the collector resistors 52,54 must exceed the voltage established by the tail current of the flip-flop in the same resistors. The tail current can be easily adjusted by means of an external resistor or wired connection, to suit a particular application. Note that the contribution of the currents from both amplifier inputs must be taken into account, assuming the input signal to be differential. If the input signal is only applied to one input of the amplifier, the tail current must be halved for the same amount of hysteresis. Under normal circumstances the input signal will be differential so as to make the circuit substantially immune to common mode input noise. It can be shown from standard communications theory that the required input noise level relative to the hysteresis level must be of the order of −24 dB to obtain a transmission bit error rate of one error in $10^{-14}$.

For example:

For an input pulse hysteresis level of 50 mV peak, a pulse current of 1 mA is transported by both grounded base amplifier emitter collector circuits, and the bias current level of the RS flip-flop must be 2 mA. To match the input impedance between 40 to 60 under maximum signal conditions would require a total power supply current of 5 mA (or a power of 15 mW at 3 volt power supply).

Under these last conditions, one can show (from Grey & Meyer) that a typical input inductance of about 0.5 nH would be obtained for typical medium size (0.8×40 micron emitters) transistors in a 10 GHz $f_T$ bipolar process and this would help to compensate parasitic capacitances of several picofarad magnitude at 1 or 2 Gb/s data rates.

Figure 5:
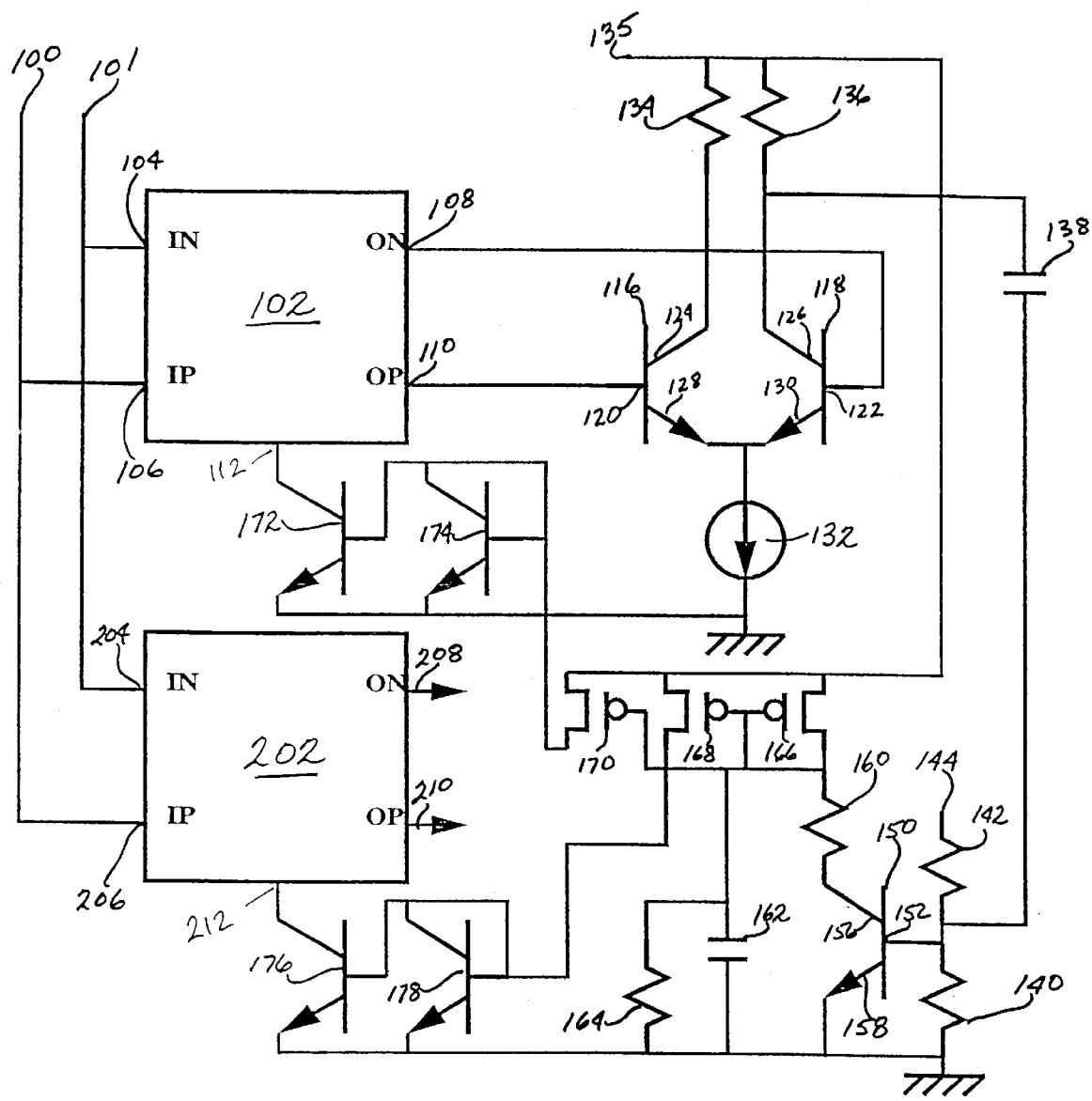
FIG. 5 is a circuit diagram of a data pulse receiver with automatic hysteresis adjustment.

FIG. 5 represents a particular application of the signal data receiver of the present invention. In this application the level of the input signal or data at line 102 and 104 is either not known or is variable. Under these conditions a fixed hysteresis level is undesirable since an optimum bit error rate cannot generally be obtained. To overcome this difficulty it is desirable to monitor the level of the incoming data signal and to adjust the hysteresis level by automatic means.

A target specification for this data receiver is that it should be able to detect incoming data pulses with a peak amplitude of 30 mV and pulse duration exceeding the hysteresis level of not less than 100 ps. The energy present in such data pulses is so small that monitoring the level accurately presents some difficulty. In this regard, recall that the data pulses are converted immediately from RZ (return to zero) format to NRZ format (non-return to zero) by the pulse receiver circuit. Direct monitoring of the amplitude of the input data stream has in fact not been possible. However, an alternative scheme has been employed which successfully monitors the input pulse height very accurately and enables optimum adjustment of the hysteresis level.

The pulse height at the output of the pulse receiver is primarily determined by the level of the hysteresis bias current to the set-reset flip-flop of FIG. 1. Therefore, at the output of the set-reset flip-flop there is no amplitude information about the incoming data stream. This flip-flop will toggle, provided that the input data signal magnitude exceeds the hysteresis level by an unknown amount. If the output of the flip-flop is connected to a differential pair, then the output of the differential pair will also toggle, if the flip-flop toggles. Further, common mode variations at the output of the flip-flop are not present at the output of the differential pair. Thus the presence or absence of pulses at the output of the differential pair can be taken to indicate that the hysteresis level is either less than or greater than the differential magnitude of the incoming data pulse. By a.c. coupling the output of the differential pair to a rectifier circuit one obtains a signal whose magnitude is either large, or very small, depending on whether the hysteresis level is less than or greater than the incoming data pulse peak magnitude. In addition, by integrating the output of the rectifier circuit, a voltage is obtained which can be used to adjust the level of the hysteresis bias current. The net result is an automatic hysteresis adjustment which continually adjusts the data pulse receiver hysteresis level to the level of the data pulses. However, it will be immediately clear that the adjustment of the hysteresis level to the peak of the data pulses will result in unreliable reception of the data since the detector circuit operates as a bang-bang control. As a result of this, a second data pulse receiver is utilized in parallel with the one which monitors the data pulse magnitude, and the hysteresis level of the second data pulse receiver is set to a proportionate lower value of that of the monitoring receiver. It is possible in fact to set the hysteresis level of the second data pulse receiver to be any desired proportion of the peak height of the data pulse, a level of 50% usually results in optimum bit error rate performance. Of course, when two data pulse receivers are connected in parallel, their individual input impedances are adjusted to provide a proper combined input termination impedance.

FIG. 5 illustrates schematically a data pulse receiver with automatic hysteresis adjustment. In FIG. 5, the data pulses are transferred to the receiver via lines 100,101. The receiver illustrated in FIG. 1 is box 102 in FIG. 5. The differential pulse input is supplied at input terminals 104 and 106. The receiver output is taken from terminals 108 and 110 while the current sink for this receiver is supplied at terminal 112. Pulse receiver 102 is used to monitor the data level. Pulse receiver 202 having input 204,206, outputs 208,210 and hysteresis current 212, is used to receive the data with very low bit-error-rate.

It is to be assumed that transistors 116, 118, 172, 174, 176 and 178 are all the same size. P-channel field effect transistors 166,168 and 170 have different sizes: in particular the ratio of the transconductance of transistors 170 and 168 determines the ratio of the current sink from receivers 102,202 respectively. Transistor pairs 172,174 and 176,178 are 1:1 mirrors used for mirroring the current sourced by transistors 170,168 respectively. Further, if the transconductance of transistor 166 is less than that of transistor 168 then the P-channel FET mirror of 166,168 will exhibit current gain. This is of advantage in increasing the accuracy of the pulse height detector circuit. In a particular embodiment of the invention, transistors, 166,168 and 170 have equal channel length and channel widths in the ratio 1:5:10 respectively. In this arrangement the hysteresis level of pulse receiver 202 will be set to half the data peak amplitude.

The differential output of receiver 102 is supplied to differential pair 116,118 at bases 120,122, respectively. Emitters 128,130 are connected to bias current source 132. Collectors 124,126 are connected to a positive supply 135 via load resistors 134,136 respectively. The differential pair 116,118 will switch if the output of pulse receiver 102 switches. This will occur if the data pulse peak magnitude is greater than the hysteresis level of the pulse receiver 102. An output of differential pair 116,118 is taken from load resistor 136 and is a.c. coupled via capacitor 138 to the detector circuit comprising resistors 140,142 and transistor 150. In a practical circuit one might also utilize the output from load resistor 134 with an additional parallel connected detector circuit, thereby increasing the sensitivity of the circuit. The second detector circuit is not shown in FIG. 5 for the sake of simplicity.

The detection circuit of resistors 140,142 and transistor 150 is biased by means of a reference voltage at 144 and the ratio of resistors 140 and 142 so that the voltage at base 152 is just less than a diode voltage drop, say about 0.75 volts. When pulses are coupled via capacitor 138 to base 152 of transistor 150, they momentarily increase the potential on base 152 and thereby cause transistor 150 to conduct current and so to lower the gate potential of FET 166. Capacitor 162 in conjunction with resistor 160 is used to integrate the pulsed current from transistor 150, so that transistors 166, 168 and 170 conduct a slowly varying current. The minimum value of the current in these transistors is set by resistor 164 which therefore sets the minimum hysteresis level. This latter feature is useful in the case of the absence of data, to prevent the "chattering" of the data output due to noise pulses. In a particular example of this circuit in which the data rate was 1.25 Gb/s, the time constant of resistor 160 and capacitor 162 was set to about 20 ns.

It is to be understood that the foregoing description and drawings attached hereto relate only to preferred embodiments of the invention. Numerous alterations or variations may be devised by one skilled in the art without departing from the spirit and scope of the invention. The invention is therefore limited only by the definition thereof in the appended claims.

We claim:

1. A data pulse receiver comprising:

a differential grounded base amplifier having a pair of bipolar transistors each of the said transistors having a base, a collector and an emitter, said bases being connected to a.c. ground;

two inputs, the first input connected to said emitter of the first transistor of said pair of bipolar transistors, said first input having impedance matching means, and the second input connected to said emitter of the second transistor of said pair of bipolar transistors, said second input having impedance matching means;

two constant current sources the first constant current source connected between said emitter of the first transistor of said pair of bipolar transistors and ground, and the second constant current source connected between said emitter of the second transistor of said pair of bipolar transistors and ground;

two load resistors, the first load resistor connected between said collector of the first transistor of said pair of bipolar transistors and a positive supply, and the second load resistor connected between said collector of the second transistor of said pair of bipolar transistors and a positive supply;

hysteresis generating means having a current supply and a set-reset flip-flop, said hysteresis generating means connected to said collector of first transistor and said collector of second transistor; and two output terminals, the first output terminal connected to the said collector of the first transistor of said pair of bipolar transistors, and the second output terminal connected to the collector of the second transistor of said pair of bipolar transistors.

2. A data pulse receiver as defined in claim 1, said data pulse having a peak amplitude of at least 30 mV and a pulse duration of at least 100 ps.

3. A data pulse receiver as defined in claim 1, said current supply for said flip-flop being programmable so as to selectively suppress input signal noise.

4. A data pulse receiver as defined in claim 1, having automatic hysteresis adjustment means.

5. A data pulse receiver as defined in claim 4, wherein said output is coupled to a differential pair, which provides an output, the presence of which is dependent on the hysteresis level of the data pulse receiver being less than the magnitude of the incoming data pulse.

6. A data pulse receiver as defined in claim 5, wherein said pulsed output from the differential pair is a.c. coupled to a rectifier circuit.

7. A data pulse receiver as defined in claim 6, wherein said rectifier circuit provides an output which is integrated in an integration circuit to obtain a d.c. voltage used to adjust the level of said hysteresis bias current.

8. A data pulse receiver as defined in claim 7, in combination with a second data pulse receiver of the same type as defined in claim 7 connected so as to receive said input data pulse in parallel with said first pulse receiver, said second data pulse receiver being provided with a hysteresis bias current, the level of which is a preset ratio of the hysteresis bias current provided to said first pulse receiver.

9. A data pulse receiver for a data pulse having a peak amplitude of at least 30 mV and a pulse duration of at least 100 picoseconds comprising:
   a grounded base amplifier having a bipolar transistor with a base, a collector and an emitter, said base being connected to a.c. ground;
   an input connected to said emitter for receiving said data pulse, said input having impedance matching means;
   a constant current source between said emitter and ground;
   a load resistor between said collector and a positive supply;
   hysteresis generating means connected to said collector and said hysteresis generating means having a current supply; and
   an output terminal between said collector and load resistor to deliver an amplified data pulse output.

10. A data pulse receiver comprising:
    a grounded base amplifier having a bipolar transistor with a base, a collector and an emitter, said base being connected to a.c. ground;
    an input connected to said emitter for receiving said data pulse, said input having impedance matching means;
    a constant current source between said emitter and ground;
    a load resistor between said collector and a positive supply;
    hysteresis generating means connected to said collector and having a current supply and a regenerative flip-flop for converting a return to zero pulse waveform into a non-return to zero data waveform; and
    an output terminal between said collector and load resistor to deliver an amplified data pulse output.

11. A data pulse receiver comprising:
    a grounded base amplifier having a bipolar transistor with a base, a collector and an emitter, said base being connected to a.c. ground;
    an input connected to said emitter for receiving said data pulse, said input having impedance matching means;
    a constant current source between said emitter and ground;
    a load resistor between said collector and a positive supply;
    hysteresis generating means connected to said collector and having a programmable current supply and a regenerative flip-flop for converting a return to zero pulse waveform into a non-return to zero data wave form, said current supply for said flip-flop being programmable so as to selectively suppressing input signal noise.

12. A data pulse receiver comprising:
    a grounded base amplifier having a bipolar transistor with a base, a collector and an emitter, said base being connected to a.c. ground;
    an input connected to said emitter for receiving said data pulse, said input having impedance matching means;
    a constant current source between said emitter and ground;
    a load resistor between said collector and a positive supply;
    hysteresis generating means connected to said collector and including a current supply and an automatic hysteresis adjustment means; and
    an output terminal between said collector and load resistor to deliver an amplified data pulse output.

13. A data pulse receiver as defined in claim 12, wherein said data pulse output is coupled to a differential pair, which provides a pulsed output, the presence of which is dependent on the hysteresis level being less than the magnitude of the incoming data pulse.

14. A data pulse receiver as defined in claim 13, wherein said pulsed output from the differential pair is a.c. coupled to a rectifier circuit.

15. A data pulse receiver as defined in claim 14, wherein said rectifier circuit provides an output which is integrated in an integration circuit to obtain a d.c. voltage used to adjust the level of said hysteresis bias current.

16. A data pulse receiver as defined in claim 15, in combination with a second data pulse receiver connected so as to receive said input data pulse in parallel with said first pulse receiver, said second data pulse receiver being provided with a hysteresis bias current, the level of which is a preset ratio of the hysteresis bias current provided to said first pulse receiver.

* * * * *